United States Patent
Jia et al.

(10) Patent No.: US 12,051,706 B2
(45) Date of Patent: Jul. 30, 2024

(54) SENSOR DEVICE, ELECTRONIC APPARATUS, AND METHOD FOR REDUCING SIGNAL NOISE

(71) Applicants: BEIJING BOE DISPLAY TECHNOLOGY CO., LTD., Beijing (CN); BOE TECHNOLOGY GROUP CO., LTD., Beijing (CN)

(72) Inventors: Peng Jia, Beijing (CN); Lei Wang, Beijing (CN); Xiaoliang Ding, Beijing (CN); Yunke Qin, Beijing (CN); Zhen Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 199 days.

(21) Appl. No.: 17/778,037

(22) PCT Filed: May 28, 2021

(86) PCT No.: PCT/CN2021/096727
§ 371 (c)(1),
(2) Date: May 19, 2022

(87) PCT Pub. No.: WO2021/258995
PCT Pub. Date: Dec. 30, 2021

(65) Prior Publication Data
US 2022/0415940 A1 Dec. 29, 2022

(30) Foreign Application Priority Data
Jun. 24, 2020 (CN) .......................... 202010591767.1

(51) Int. Cl.
*H01L 27/146* (2006.01)
*H01L 31/0224* (2006.01)
(Continued)

(52) U.S. Cl.
CPC ............. *H01L 27/14612* (2013.01); *H01L 31/022466* (2013.01); *H01L 31/105* (2013.01); *H01L 31/12* (2013.01)

(58) Field of Classification Search
CPC ..... H01L 31/12; H01L 31/105; H01L 31/103; H01L 31/102; H01L 31/022491;
(Continued)

(56) References Cited

U.S. PATENT DOCUMENTS

| | | | | |
|---|---|---|---|---|
| 8,564,314 | B2 * | 10/2013 | Shaikh | G06F 3/0445 |
| | | | | 324/687 |
| 10,438,046 | B2 * | 10/2019 | He | G06V 40/40 |
| 10,565,423 | B2 * | 2/2020 | Tian | G06T 3/4038 |

(Continued)

FOREIGN PATENT DOCUMENTS

| | | |
|---|---|---|
| CN | 102566840 A | 7/2012 |
| CN | 107004126 A | 8/2017 |

(Continued)

*Primary Examiner* — John R Lee
(74) *Attorney, Agent, or Firm* — Chiwin Law LLC

(57) ABSTRACT

A sensor device, an electronic apparatus and a method for reducing signal noise are provided. The sensor device includes a first detection region and a second detection region. The first detection region includes at least one detector unit, the detector unit includes a first detection electrode and a second detection electrode opposed to each other and a first insulating layer, the first detection electrode is electrically insulated from the second detection electrode by the first insulating layer, the second detection region includes at least one detector unit, the sensor unit includes a first sensor electrode, a second sensor electrode and a first photosensitive layer, and the first photosensitive layer is electrically connected to the first sensor electrode and the second sensor electrode.

20 Claims, 7 Drawing Sheets

(51) Int. Cl.
*H01L 31/105* (2006.01)
*H01L 31/12* (2006.01)

(58) Field of Classification Search
CPC ..... H01L 31/022483; H01L 31/022475; H01L 31/022466; H01L 31/0224; H01L 27/14616; H01L 27/14614; H01L 27/14612; H01L 27/1461; H01L 27/14609; H01L 27/146; G06V 40/13; G06V 40/12; G06K 7/10851; G06F 3/042; G06F 3/0412; G06F 3/041
See application file for complete search history.

(56) References Cited

U.S. PATENT DOCUMENTS

| | | | |
|---|---|---|---|
| 10,726,237 B2 * | 7/2020 | Liang | H01L 31/18 |
| 11,354,928 B2 | 6/2022 | Tang et al. | |
| 11,403,869 B2 * | 8/2022 | Wu | H01L 27/1462 |
| 11,887,400 B2 * | 1/2024 | Niu | H10K 50/865 |
| 2017/0193265 A1 * | 7/2017 | Chan | G06F 3/0445 |
| 2022/0085109 A1 * | 3/2022 | Kim | H10K 59/65 |
| 2022/0415940 A1 * | 12/2022 | Jia | G06F 18/00 |

FOREIGN PATENT DOCUMENTS

| | | |
|---|---|---|
| CN | 107633234 A | 1/2018 |
| CN | 108321152 A | 7/2018 |
| CN | 108646949 A | 10/2018 |
| CN | 110991396 A | 4/2020 |

\* cited by examiner ial Application No. PCT/CN2021/096727 filed on May 28, 2021, designating the United States of America and claiming priority to Chinese Patent Application No. 202010591767.1, filed on Jun. 24, 2020. The present application claims priority to and the benefit of the above-identified applications and the above-identified applications are incorporated by reference herein in their entirety.

SENSOR DEVICE, ELECTRONIC APPARATUS, AND METHOD FOR REDUCING SIGNAL NOISE

CROSS-REFERENCE TO RELATED APPLICATION

This application is a U.S. National Phase Entry of International Application No. PCT/CN2021/096727 filed on May 28, 2021, designating the United States of America and claiming priority to Chinese Patent Application No. 202010591767.1, filed on Jun. 24, 2020. The present application claims priority to and the benefit of the above-identified applications and the above-identified applications are incorporated by reference herein in their entirety.

TECHNICAL FIELD

Embodiments of the present disclosure relate to a sensor device, an electronic apparatus and a method for reducing signal noise.

BACKGROUND

Under-screen fingerprint identification, that is, fingerprint identification being performed inside the display screen, is a solution to realize the fingerprint identification function under the trend of full screen display.

SUMMARY

At least one embodiment of the disclosure provides a sensor device comprising a first detection region and a second detection region. The first detection region comprises at least one detector unit, the detector unit comprises a first detection electrode and a second detection electrode opposed to each other and a first insulating layer, the first detection electrode is electrically insulated from the second detection electrode by the first insulating layer, the second detection region comprises at least one detector unit, the sensor unit comprises a first sensor electrode, a second sensor electrode and a first photosensitive layer, and the first photosensitive layer is electrically connected to the first sensor electrode and the second sensor electrode.

For example, the first detection region is on a periphery of the second detection region and does not overlap with the second detection region.

For example, the detector unit further comprises a second photosensitive layer, and the second photosensitive layer is electrically insulated from the first detection electrode through the first insulating layer.

For example, the detector unit further comprises a second insulating layer, and the second photosensitive layer is electrically insulated from the second detection electrode through the second insulating layer.

For example, the second photosensitive layer is interposed between the first detection electrode and the second detection electrode, and includes a first P-type semiconductor sub-layer, a first intrinsic sub-layer and a first N-type semiconductor sub-layer which are sequentially stacked between the first detection electrode and the second detection electrode.

For example, the first detection electrode is at least partially transparent; or the second detection electrode is at least partially transparent; or both the first detection electrode and the second detection electrode are at least partially transparent.

For example, the detector unit further comprises a first switching transistor, and a first electrode of the first switching transistor is electrically connected to the first detection electrode or the second detection electrode.

For example, the sensor device further comprises a first gate signal line and a first signal read line. The first gate signal line is electrically connected to a gate electrode of the first switching transistor, and the first signal read line is electrically connected to a second electrode of the first switching transistor.

For example, the at least one detector unit comprises a plurality of detector units, and the plurality of detector units are arranged in an array.

For example, the first photosensitive layer is interposed between the first sensor electrode and the second sensor electrode, and comprises a second P-type semiconductor sub-layer, a second intrinsic sub-layer and a second N-type semiconductor sub-layer that are sequentially stacked between the first sensor electrode and the second sensor electrode.

For example, the first sensor electrode is at least partially transparent; or the second sensor electrode is at least partially transparent; or both the first sensor electrode and the second sensor electrode are at least partially transparent.

For example, the sensor unit further comprises a second switching transistor, and a first electrode of the second switching transistor is electrically connected to the first sensor electrode or the second sensor electrode.

For example, the sensor device further comprises a second gate signal line and a second signal read line, the second gate signal line is electrically connected to a gate electrode of the second switching transistor, and the second signal read line is electrically connected to a second electrode of the second switching transistor.

For example, the at least one sensor unit comprises a plurality of sensor units, and the plurality of sensor units are arranged in an array.

For example, the first detection electrode and the first sensor electrode are provided in a same layer and have a same shape and size, the second detection electrode and the second sensor electrode are provided in a same layer and have a same shape and size.

For example, the first detection electrode and the first sensor electrode are provided in a same layer and have a same shape and size, the second detection electrode and the second sensor electrode are provided in a same layer and have a same shape and size, the first photosensitive layer and the second first photosensitive layer are provided in a same layer and have a same shape and size.

At least one embodiment provides an electronic apparatus comprising: the sensor device as described above; and a signal processing device, in signal connection with the sensor device. The signal processing device is configured to obtain a first signal by the at least one detector unit of the first detection region and obtain a second signal by the at least one sensor unit of the second detection region of the sensor device, and perform a noise reduction operation on the second signal by using the first signal as a common mode noise signal of the second signal.

For example, the electronic apparatus further comprises a display panel. The display panel comprises a display region and a periphery region disposed on a periphery of the display region, the sensor device is disposed in the display region or in the periphery region.

At least one embodiment provides a method for reducing signal noise, comprising: obtaining a first signal through at least one detector unit in a first detection region, wherein the detector unit comprises a first detection electrode, a second detection electrode and a first insulating layer, and the first detection electrode is electrically insulated from the second detection electrode by the first insulating layer; obtaining a second signal through at least one sensor unit in a second detection region, wherein the sensor unit comprises a first sensor electrode, a second sensor electrode and a second photosensitive layer, and the second photosensitive layer is electrically connected to the first sensor electrode and the second sensor electrode; and performing a noise reduction operation on the second signal by using the first signal as a common mode noise signal of the second signal.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

Figure 1A:
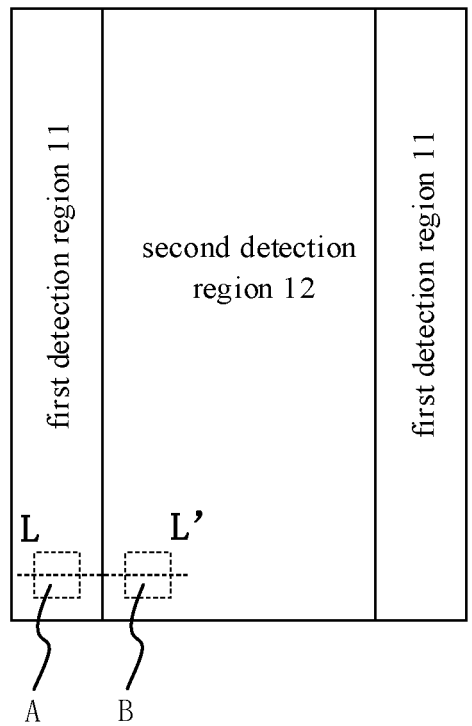
FIG. 1A is a block schematic diagram of an example of a sensor device according to at least one embodiment of the present disclosure.

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

In order to keep the following description of the embodiments of the present disclosure clear and concise, the present disclosure omits detailed descriptions of known functions and known components.

In some technical solutions, in order to reduce the signal noise of a sensor, a non-responsive sensor unit is designed in the sensor array. For example, in the field of under-screen fingerprint recognition, in the case of using a photodiode as a sensor unit of a photosensitive element for fingerprint identification, a light-shielding metal is used to shield the photodiode to prevent the photodiode from being irradiated by light, so that the shielded photodiode acts as a non-responsive sensor unit; however, because the reflection of the light-shielding metal may be observed by the user, it will bring about a problem of visualization of the light-shielding metal, which will adversely affect the display effect.

Embodiments of the present disclosure provide a sensor device, an electronic apparatus, and a method for reducing signal noise, so as to reduce the noise of a signal that is detected, improve the signal-to-noise ratio, and avoid the use of light-shielding metals so as not to affect the display effect.

In the present disclosure, each embodiment of the present disclosure will be described by taking a sensor device for fingerprint recognition as an example, however, it should be understood that the embodiments of the present disclosure are not limited to this.

Figure 1B:
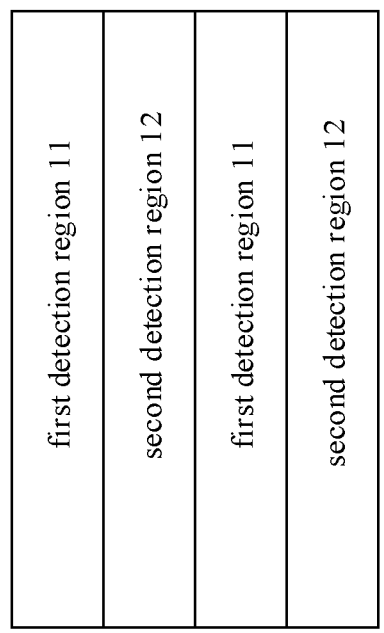
FIG. 1B is a block schematic diagram of another example of the sensor device according to at least one embodiment of the present disclosure.

FIG. 1A is a block schematic diagram of an example of a sensor device according to at least one embodiment of the present disclosure, and FIG. 1B is a block schematic diagram of another example of a sensor device according to at least one embodiment of the present disclosure.

As illustrated in FIG. 1A and FIG. 1B, a sensor device 10 according to at least one embodiment of the present disclosure comprises a first detection region 11 and a second detection region 12. Although two first detection regions 11 and one second detection region 12 are illustrated in FIG. 1A and two first detection regions 11 and two second detection regions 12 are illustrated in FIG. 1B, it should be understood that embodiments of the present disclosure do not limit the total number of the first detection region 11 and the total number of the second detection region 12. For example, in other embodiments, the sensor device 10 comprises one first detection region 11 or three or more than three first detection regions 11; and the sensor device 10 comprises there or more than three second detection regions 12.

For example, the first detection region 11 is on a periphery of the second detection region 12 and does not overlap with the second detection region 12. Although FIG. 1A illustrates that the first detection region 11 is on both sides of the second detection region 12 and FIG. 1B illustrates that the first detection region 11 and the second detection region 12 are alternately arranged, it should be understood that the embodiments of the present disclosure do not limit the arrangement manner of the first detection region 11 and the second detection region 12. For example, in other embodiments, the first detection region 11 is arranged to surround the second detection region 12, for example, the first detection region 11 is provided on all sides of the second detection region 12; or the first detection region 11 and the second detection region 12 are arranged in multiple rows and multiple columns.

The first detection region 11 comprises at least one detector unit A. The embodiments of the present disclosure do not limit the arrangement manner of the detector unit in the first detection region 11. For example, in a case where the first detection region 11 comprises a plurality of detector units, the plurality of detector units are arranged in an array in order to be easily manufactured and correspond to the arrangement of sensor units in the second detection region (as described below). It should be understood that the total number of detector units A illustrated in FIG. 1A is only exemplary, and it is not limited by the embodiments of the present disclosure.

Figure 2:
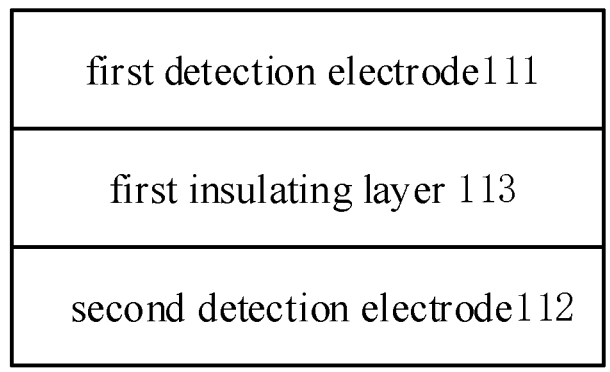
FIG. 2 is a schematic structural diagram of an example of a detector unit according to at least one embodiment of the present disclosure.

FIG. 2 is a schematic structural diagram of an example of the detector unit according to at least one embodiment of the present disclosure. The detector unit comprises a first detection electrode 111 and a second detection electrode 112 opposed to each other and a first insulating layer 113. The first detection electrode 111 is electrically insulated from the second detection electrode 112 by the first insulating layer 113. For example, the first detection electrode 111, the first insulating layer 113 and the second detection electrode 112 are planar and stacked together. The orthographic projection of the first detection electrode 111 on the plane of the second detection electrode 112 for example at least partially overlaps with the second detection electrode 112. That is, the first detection electrode 111 and the second detection electrode 112 form a capacitor together with the first insulating layer 113. For example, the first insulating layer 113 is interposed between the first detection electrode 111 and the second detection electrode 112.

The materials of the first detection electrode 111 and the second detection electrode 112 for example are the same or different, and both for example are metals, alloys, conductive oxides, conductive polymers, or a combination thereof.

For example, in at least one embodiment, the first detection electrode 111 and the second detection electrode 112 are formed of different materials. Examples of the material of one of the first detection electrode 111 and the second detection electrode 112 comprise, but are not limited to, nickel (Ni), silver (Ag), gold (Au), platinum (Pt), palladium (Pd), selenium (Se), rhodium (Rh), ruthenium (Ru), iridium (Ir), rhenium (Re), tungsten (W), molybdenum (Mo), chromium (Cr), tantalum (Ta), niobium (Nb), aluminum (Al), iron (Fe), cobalt (Co), copper (Cu) or their alloys or their oxides, or tin oxide, indium tin oxide (ITO), zinc oxide, titanium oxide, PEDOT:PSS (3,4-Ethylenedioxythiophene: poly(4-styrenesulfonic acid)), PANI (polyaniline), etc.

For example, examples of the material of the other of the first detection electrode 111 and the second detection electrode 112 comprise, but are not limited to, magnesium (Mg), calcium (Ca), indium (In), lithium (Li), aluminum (Al), silver (Ag) or their alloys or their fluorides, such as magnesium (Mg)-silver (Ag) alloy, lithium (Li)-fluorine compound, lithium (Li)-oxygen (O) compound, and the like.

Alternatively, in at least one embodiment, the first detection electrode 111 and the second detection electrode 112 are formed of the same material, which is not limited in the embodiments of the present disclosure.

In at least one embodiment, the first detection electrode 111 is at least partially transparent; alternatively, the second detection electrode 112 is at least partially transparent; alternatively, both the first detection electrode 111 and the second detection electrode 112 are at least partially transparent.

The first insulating layer 113 for example comprises any suitable insulating material. Examples of the material of the first insulating layer 113 comprises, but are not limited to, silicon dioxide, silicon nitride, aluminum oxide, zirconium dioxide, yttrium oxide, tantalum pentoxide, lanthanum oxide, titanium dioxide, or a combination thereof.

In at least one embodiment, the detector unit further comprises a second photosensitive layer, and the first detection electrode 111 or the second detection electrode 112 is electrically insulated from the second photosensitive layer by the first insulating layer. For example, the second photosensitive layer is interposed between the first detection electrode 111 and the second detection electrode 112; however, it should be understood that embodiments of the present disclosure are not limited thereto.

Figure 3:
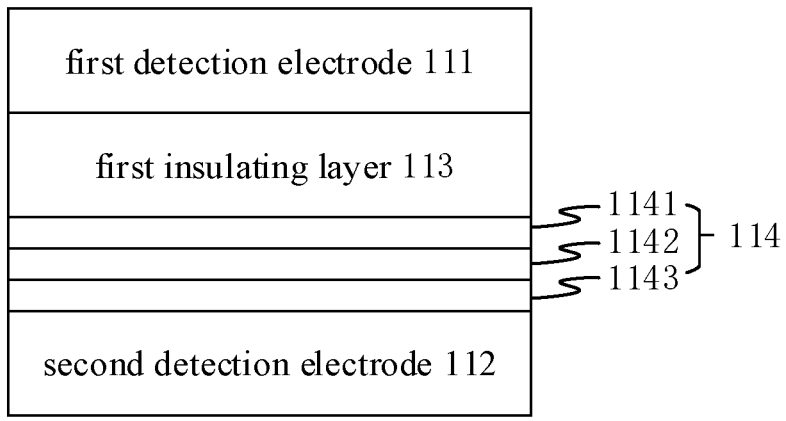
FIG. 3 is a schematic structural diagram of another example of the detector unit according to at least one embodiment of the present disclosure.

FIG. 3 is a schematic structural diagram of another example of the detector unit according to at least one embodiment of the present disclosure. The detector unit in FIG. 3 is basically the same as the detector unit in FIG. 2 except that the detector unit in FIG. 3 further comprises a second photosensitive layer 114. The similarities between the structure illustrated in FIG. 2 and the structure illustrated in FIG. 3 will not be repeated.

The second photosensitive layer 114 is electrically insulated from the first detection electrode 111 by the first insulating layer 113, and the second photosensitive layer 114 is interposed between the first detection electrode 111 and the second detection electrode 112. The second photosensitive layer 114 for example is electrically connected with the second detection electrode 112. The second photosensitive layer 114 generates an electrical signal because of the light irradiating the second photosensitive layer 114. For example, the second photosensitive layer 114 is planar and stacked with the first detection electrode 111, the first insulating layer 113 and the second detection electrode 112.

It should be understood that the stacking sequence in FIG. 3 is only schematic; and in some embodiments, the stacking sequence of the first detection electrode 111, the first insulating layer 113, the second photosensitive layer 114 and the second detection electrode 112 for example is in reverse to the stacking sequence illustrated in FIG. 3 (that is, the first detection electrode 111 is located at the lowest layer, and the second detection electrode 112 is located at the topmost layer), the embodiments of the present disclosure are not limited thereto.

The second photosensitive layer 114 for example comprises a semiconductor material such as silicon and germanium, further for example, is of PN type, PIN type, or the like. In at least one embodiment, the second photosensitive layer 114 is of, for example, the PIN type. For example, the second photosensitive layer 114 comprises a first P-type semiconductor sub-layer 1141, a first intrinsic sub-layer 1142 and a first N-type semiconductor sub-layer 1143 which are sequentially stacked. The first P-type semiconductor sub-layer 1141, the first intrinsic sub-layer 1142 and the first N-type semiconductor sub-layer 1143 may all be made of conventional materials in the art, which are not limited in the embodiments of the present disclosure.

In the case where the first detection electrode 111 or the second detection electrode 112 or the first detection electrode 111 and the second detection electrode 112 are at least partially transparent, the second photosensitive layer 114 is allowed to be irradiated with light. For example, the sensor device is used for fingerprint recognition, and the light emitted from the display panel or a separately arranged light source for fingerprint recognition is irradiated to the second photosensitive layer 114 through the first detection electrode 111 or the second detection electrode 112 after being reflected by the finger. However, because the first detection electrode 111 or the second detection electrode 112 is electrically insulated from the second photosensitive layer 114 by the first insulating layer 113, the charges accumulated in the second photosensitive layer 114 because of being exposed to light cannot be read out by the first detection electrode 111 or the second detection electrode 112.

In at least one embodiment, both the first detection electrode 111 and the second detection electrode 112 are electrically insulated from the second photosensitive layer 114 by an insulating layer.

Figure 4:
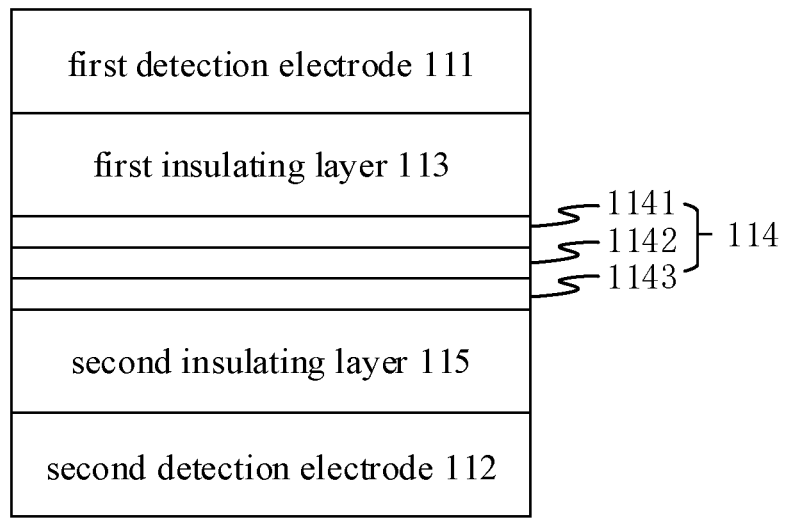
FIG. 4 is a schematic structural diagram of another example of the detector unit according to at least one embodiment of the present disclosure.

FIG. 4 is a schematic structural diagram of another example of the detector unit according to at least one embodiment of the present disclosure. The detector unit in FIG. 4 is basically the same as the detector unit in FIG. 3 except that the detector unit in FIG. 4 further comprises a second insulating layer 115. The similarities between the structure illustrated in FIG. 4 and the structure illustrated in FIG. 3 will not be repeated.

The first detection electrode 111 is electrically insulated from the second photosensitive layer 114 by the second insulating layer 115. The second insulating layer 115 for example is planar and staked with the first detection electrode 111, the first insulating layer 113, the second detection electrode 112 and the second photosensitive layer 114.

The second insulating layer 115 for example comprises any suitable insulating material. Examples of the material of the second insulating layer 115 for example comprise, but are not limited to, silicon dioxide, silicon nitride, aluminum oxide, zirconium dioxide, yttrium oxide, tantalum pentoxide, lanthanum oxide, titanium dioxide, or combinations thereof. The first insulating layer 113 and the second insulating layer 115 are formed of the same or different materials, which are not limited in the embodiments of the present disclosure.

As illustrated in FIG. 1A, the second detection region 12 comprises at least one sensor unit B. The embodiments of the present disclosure does not limit the arrangement manner of the sensor unit in the second detection region 12. For example, in the case where the second detection region 12 comprises a plurality of sensor units, the plurality of sensor units for example are arranged in an array in order to be easily manufactured and facilitate the formation of a detection image to broaden the scope of application. It should be understood that the total number of the sensor units B illustrated in FIG. 1A is only exemplary, and is not limited by the embodiments of the present disclosure.

Figure 5:
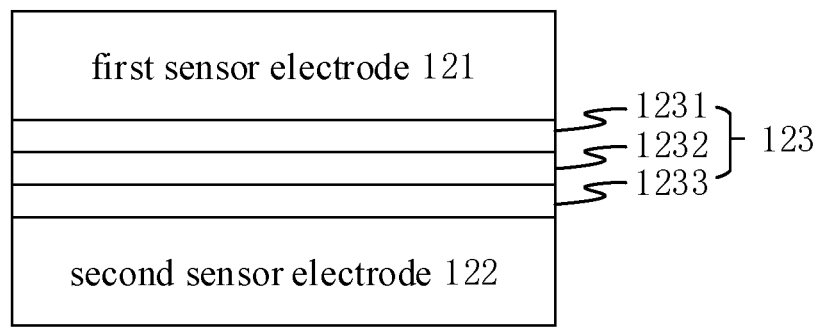
FIG. 5 is a schematic structural diagram of an example of a sensor unit according to at least one embodiment of the present disclosure.

FIG. 5 is a schematic structural diagram of an example of the sensor unit according to at least one embodiment of the present disclosure. As illustrated in FIG. 5, the sensor unit according to at least one embodiment of the present disclosure for example comprises a first sensor electrode 121, a second sensor electrode 122 and a first photosensitive layer 123. The first photosensitive layer 123 is electrically connected to the first sensor electrode 121 and the second sensor electrode 122 and is interposed between the first sensor electrode 121 and the second sensor electrode 122.

The materials of the first sensor electrode 121 and the second sensor electrode 122 for example are the same or different, and both of them for example are metals, alloys, conductive oxides, conductive polymers, or a combination thereof.

For example, the first sensor electrode 121 and the second sensor electrode 122 for example are formed of different materials. Examples of a material of one of the first sensor electrode 121 and the second sensor electrode 122 for example comprise, but are not limited to, nickel (Ni), silver (Ag), gold (Au), platinum (Pt), palladium (Pd), selenium (Se), rhodium (Rh), ruthenium (Ru), iridium (Ir), rhenium (Re), tungsten (W), molybdenum (Mo), chromium (Cr), tantalum (Ta), niobium (Nb), aluminum (Al), iron (Fe), cobalt (Co), copper (Cu) or their alloys or oxides, or tin oxide, indium tin oxide (ITO), zinc oxide, titanium oxide, PEDOT:PSS (3,4-sub Ethylenedioxythiophene:poly(4-styrenesulfonic acid)), PANI (polyaniline), etc.

For example, examples of a material of the other of the first sensor electrode 121 and the second sensor electrode 122 for example comprise, but are not limited to, magnesium (Mg), calcium (Ca), indium (In), lithium (Li), aluminum (Al), silver (Ag) or their alloys or their fluorides, such as magnesium (Mg)-silver (Ag) alloy, lithium (Li)-fluorine compound, lithium (Li)-oxygen (O) compound, and the like.

In at least one embodiment, the first sensor electrode 121 and the second sensor electrode 122 for example are formed of the same material, which is not limited by the embodiments of the present disclosure.

The first sensor electrode 121 and the first detection electrode 111 for example are formed of the same or different materials, and the second sensor electrode 122 and the second detection electrode 112 for example are formed of the same or different materials, which are not limited by the embodiments of the present disclosure.

In at least one embodiment of the present disclosure, the electrode provided on a light-entering side of the first photosensitive layer 123 for example is at least partially transparent. For example, the first sensor electrode 121 is at least partially transparent; alternatively, the second sensor electrode 122 is at least partially transparent; alternatively, both the first sensor electrode 121 and the second sensor electrode 122 are at least partially transparent.

The first sensor electrode 121, the first photosensitive layer 123 and the second sensor electrode 122 for example form a photodiode. By applying a voltage to the first sensor electrode 121 and the second sensor electrode 122, the photodiode has a small saturated reverse current in the case where there is no light irradiating the first photosensitive layer 123, and the photodiode is turned off at this time; and the saturated reverse current is greatly increased to form a photocurrent in the case where the first photosensitive layer 123 is irradiated with light, and the magnitude of the photocurrent changes with the change of the intensity of the incident light.

The first photosensitive layer 123 for example comprises a semiconductor material such as silicon and germanium, further for example, is of PN type, PIN type, or the like. In at least one embodiment, the first photosensitive layer 123 is of, for example, the PIN junction. For example, the first photosensitive layer 123 for example comprises a second P-type semiconductor sub-layer 1231, a second intrinsic sub-layer 1232 and a second N-type semiconductor sub-layer 1233 that are sequentially stacked. The second P-type semiconductor sub-layer 1231, the second intrinsic sub-layer 1232, and the second N-type semiconductor sub-layer 1233 may all be made of conventional materials in the art, which are not limited in the embodiments of the present disclosure.

The first P-type semiconductor sub-layer 1141 and the second P-type semiconductor sub-layer 1231 for example are formed of the same or different materials; the second intrinsic sub-layer 1142 and the second intrinsic sub-layer 1232 for example are formed of the same or different materials; and the first N-type semiconductor sub-layer 1143 and the second N-type semiconductor sub-layer 1233 for example are formed of the same or different materials, which are not limited by the embodiments of the present disclosure.

In the case where the first sensor electrode 121 or the second sensor electrode 122 or the first sensor electrode 121 and the second sensor electrode 122 are at least partially transparent, the first photosensitive layer 123 for example is allowed to be irradiated with light. For example, the sensor device is used for fingerprint recognition, and the light emitted from the display panel or the separately arranged light source for fingerprint recognition is irradiated to the first photosensitive layer 123 through the first sensor electrode 121 or the second sensor electrode 122 after being reflected by the finger. Because the first sensor electrode 121 and the second sensor electrode 122 are electrically connected to the first photosensitive layer 123, the charges accumulated in the first photosensitive layer 123 because of being exposed to the light are read out by the first sensor electrode 121 or the second sensor electrode 122.

Figure 6:
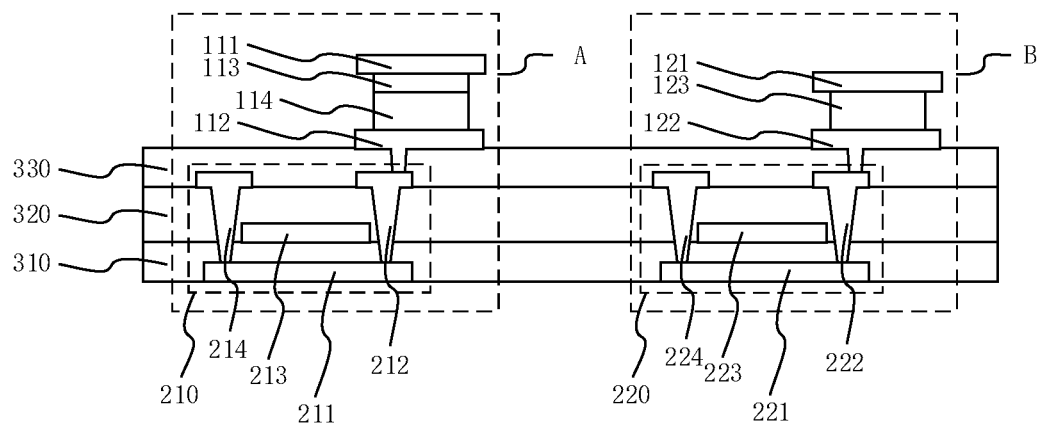
FIG. 6 is a cross-sectional view taken along line L-L' in FIG. 1A.

FIG. 6 is a cross-sectional view taken along line L-L' in FIG. 1A. As an example, in FIG. 6, the detector unit A is illustrated as having the structure illustrated in FIG. 3; however, it should be understood that in other embodiments, the detector unit A for example has the structure illustrated in FIG. 2, the structure illustrated in FIG. 4. or other suitable structures, which are not limited by the embodiments of the present disclosure.

As illustrated in FIG. 6, according to at least one embodiment of the present disclosure, the detector unit A for example further comprises a first switching transistor 210. The first switching transistor 210 for example comprises a first active layer 211, a first electrode 212, a first gate electrode 213 and a second electrode 214. A gate insulating layer 310 covers the first active layer 211, and the first active layer 211 is electrically insulated from the first gate electrode 213 by the gate insulating layer 310. A first interlayer insulating layer 320 covers the first gate electrode 213. The first electrode 212 and the second electrode 214 of the first switching transistor 210 are on the side of the first interlayer insulating layer 320 facing away from the gate insulating layer 310, and the first electrode 212 and the second electrode 214 of the first switching transistor 210 are electrically connected to the first active layer 211 through the a via hole in the interlayer insulating layer 320 and the gate insulating layer 310.

A second interlayer insulating layer 330 covers the first electrode 212 and the second electrode 214 of the first switching transistor 210. As an example, in FIG. 6, in the detector unit A, the second detection electrode 112 is electrically connected to the first electrode 212 of the first switching transistor 210 through a via hole in the second interlayer insulating layer 330.

As illustrated in FIG. 6, according to at least one embodiment of the present disclosure, the sensor unit B for example further comprises a second switching transistor 220. The second switching transistor 220 for example comprises a second active layer 221, a first electrode 222, a second gate electrode 223 and a second electrode 224.

As illustrated in FIG. 6, some or all of the corresponding layers of the first switching transistor 210 and the second switching transistor 220 for example are respectively disposed in the same layer. For example, the first active layer 211 and the second active layer 221 for example are disposed in the same layer. For example, the first gate electrode 213 and the second gate electrode 223 for example are disposed in the same layer. For example, the first electrode 212 of the first switching transistor 210 and the first electrode 222 of the second switching transistor 220 for example are disposed in the same layer. For example, the second electrode 214 of the first switching transistor 210 and the second electrode 224 of the second switching transistor 220 for example are disposed in the same layer. By arranging the first switching transistor 210 and the second switching transistor 220 in the same layer, the layer arrangement of the sensor device can be simplified and the thickness of the sensor device can be reduced. However, it should be understood that in other embodiments, some or all of the corresponding film layers of the first switching transistor 210 and the second switching transistor 220 for example are respectively disposed in different layers, which is not limited by the embodiments of the present disclosure.

It should be understood that in the embodiments of the present disclosure, expressions such as "disposed in the same layer" or "formed in the same layer" refer to using the same film forming process to form a film for forming specific patterns, and then forming the layer with the specific patterns by performing a single patterning process on the film with using the same mask. Depending on the specific patterns, the single patterning process for example comprises multiple exposure, development or etching processes, the specific patterns in the formed layer for example are continuous or discontinuous, and these specific patterns for example are at different heights or have different thicknesses.

In the embodiments of the present disclosure, the patterning or patterning process for example only comprises a photolithography process, or comprises a photolithography process and an etching step, or for example comprises other processes for forming predetermined patterns such as printing and inkjet. The photolithography process refers to the process including film formation, exposure, development, etc., using photoresist, mask, exposure machine, etc. to form patterns. The corresponding patterning process can be selected according to the structure formed in the embodiments of the present disclosure.

As illustrated in FIG. 6, in the case where the corresponding layers of the first switching transistor 210 and the second switching transistor 220 are respectively disposed in the same layer, the gate insulating layer 310 for example also covers the second active layer 221, and the second active layer 221 is electrically insulated from the second gate electrode 223 through the gate insulating layer 310. The first interlayer insulating layer 320 covers the second gate electrode 223. The first electrode 222 and the second electrode 224 of the second switching transistor 220 are on the side of the first interlayer insulating layer 320 facing away from the gate insulating layer 310, and the first electrode 222 and the second electrode 224 of the second switching transistor 220 are electrically connected to the second active layer 221 through a via hole in the first interlayer insulating layer 320.

The second interlayer insulating layer 330 covers the first electrode 222 and the second electrode 224 of the second switching transistor 220. As an example, in FIG. 6, in the sensor unit B, the second sensor electrode 122 is electrically connected to the first electrode 222 of the second switching transistor 220 through a via hole in the second interlayer insulating layer 330.

It should be noted that the transistors used in the embodiments of the present disclosure may all be thin film transistors, field effect transistors, or other switching elements with the same characteristics, and the embodiments of the present disclosure are described by taking the thin film transistors as an example. The source electrode and drain electrode of the transistor used here for example are symmetrical in structure, so the source electrode and drain electrode for example are no different in structure.

In the embodiments of the present disclosure, in order to distinguish the two electrodes (ie, the source electrode and the drain electrode) of the transistor except the gate electrode, it is directly described that one of the two electrodes is the first electrode and the other is the second electrode.

The sensor device according to at least one embodiment of the present disclosure for example further comprises a first gate signal line and a first signal read line. The first gate signal line is electrically connected to the gate electrode of the first switching transistor, and the first signal read line is electrically connected to the second electrode of the first switching transistor.

Figure 7:
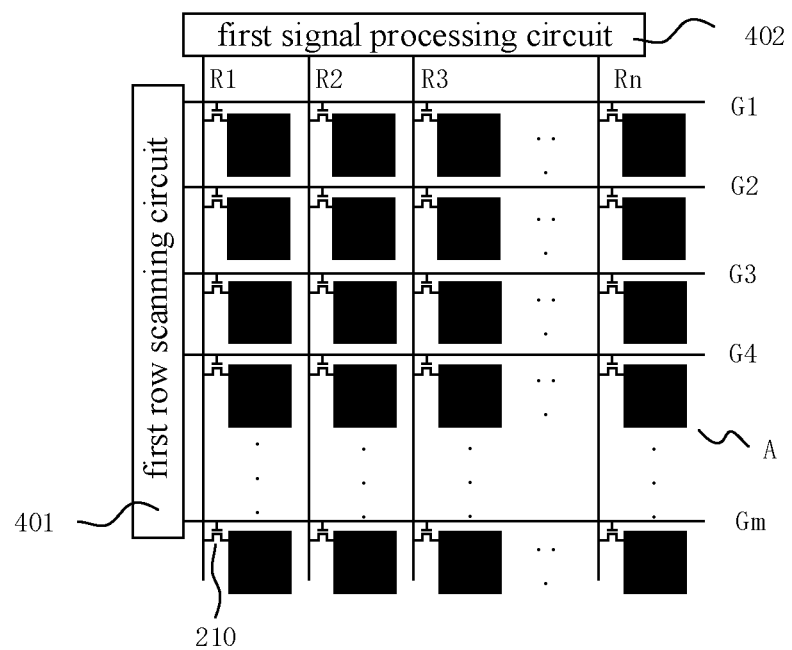
FIG. 7 is a top view of a first detection region according to at least one embodiment of the present disclosure.

FIG. 7 is a top view of the first detection region according to at least one embodiment of the present disclosure. As illustrated in FIG. 7, the sensor device according to at least one embodiment of the present disclosure for example further comprises a plurality of first gate signal lines G1-Gm and a plurality of first signal read line R1-Rn. In the embodiment illustrated in FIG. 7, the first detection region comprises a plurality of detector units A, and the plurality of detector units A are arranged in an array having m rows*n columns (m and n are positive integers and at least one of them is greater than 1). In addition, the first detection region further comprises a plurality of first switching transistors 210, which are also arranged in an array having m rows*n columns. The plurality of first switching transistors 210 are electrically connected to the plurality of detector units A in one-to-one correspondence, for example, the first electrodes of the first switching transistors 210 are respectively electrically connected to the second detection electrodes of the detector units A.

Each of the first gate signal lines G is electrically connected to the gate electrodes of a row of the first switching transistors 210. Each of the first signal read lines R is electrically connected to a column of the first switching transistors 210. For example, the second electrode of each of the first switching transistors 210 is electrically connected to the first signal read line R.

For example, the first gate signal lines G1-Gm are all connected to a first row scanning circuit 401 to receive scanning signals. The first switching transistors 210 are turned on or off under the control of the scanning signals.

For example, the first signal read lines R1-Rn are all connected to a first signal processing circuit 402 so that the first signal read lines R1-Rn transmit a first signal detected by the detector units A to the first signal processing circuit 402.

Figure 8:
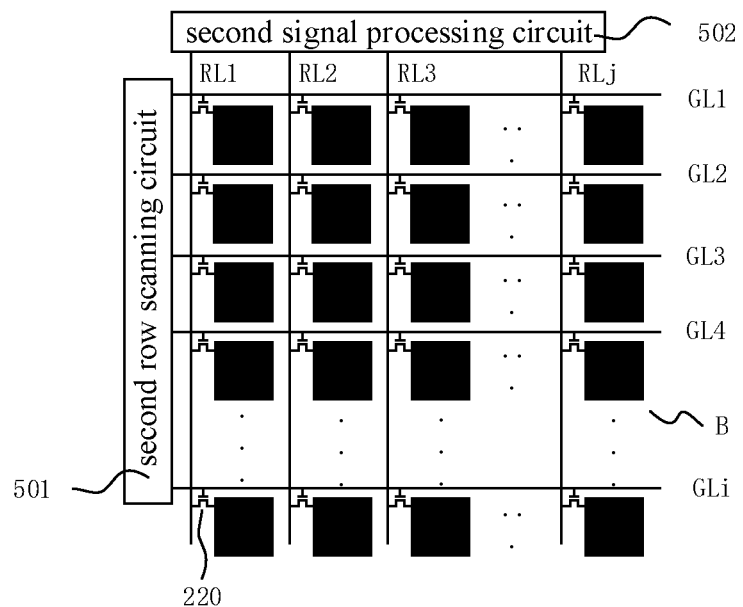
FIG. 8 is a top view of a second detection region according to at least one embodiment of the present disclosure.

FIG. 8 is a top view of the second detection region according to at least one embodiment of the present disclosure. As illustrated in FIG. 8, the sensor device according to at least one embodiment of the present disclosure for example further comprises a plurality of second gate signal lines GL1-GLi and a plurality of second signal read line RL1-RLj. In the embodiment illustrated in FIG. 8, the second detection region comprises a plurality of sensor units B, and the plurality of sensor units B are arranged in an array having i rows*j columns (i and j are positive integers and at least one of them is greater than 1). In addition, the second detection region further comprises a plurality of second switching transistors 220, which are also arranged in an array having i rows*j columns. The plurality of second switching transistors 220 are electrically connected to the plurality of sensor units B in a one-to-one correspondence, for example, the first electrodes of the second switching transistors 220 are respectively electrically connected to the second sensor electrodes of the sensor units B.

Each of the second gate signal lines GL is electrically connected to the gate electrodes of a row of the second switching transistors 220. Each of the second signal read lines RL is electrically connected to a column of second switching transistors 220. For example, the second electrode of each of the second switching transistors 220 is electrically connected to the second signal read line RL.

For example, the second gate signal lines GL1-GLi are all connected to the second row scanning circuit 501 to receive scanning signals. The second switching transistors 220 are turned on or off under the control of the scanning signals.

For example, the second signal read lines RL1-RLj are all connected to the second signal processing circuit 502 so that the second signal read lines RL1-RLj transmit a second signal detected by the sensor units B to the second signal processing circuit 502.

In addition, at least part of the first gate signal lines G in the first detection region for example further serve as the second gate signal lines in the second detection region, and the first row scanning circuit 401 for example further serves as the second row scanning circuit 501, so that a row of detector units A and a row of sensor units B connected with the same first gate signal line G receive the same scanning signal from the first row scanning circuit 401. Of course, in other embodiments, for example, at least part of the second gate signal lines GL in the second detection region further serve as the first gate signal lines in the first detection region and the second row scanning circuit 501 for example further serves as the first row scanning circuit 401, which will not be described in detail herein.

In addition, the first signal processing circuit 402 and the second signal processing circuit 502 for example are integrated in the same signal processing circuit, which is not limited by the embodiments of the present disclosure.

It should be understood that the first row scanning circuit 401, the first signal processing circuit 402, the second row scanning circuit 501 and the second signal processing circuit 502 for example are not comprised in the sensor device, but implemented by circuits outside the sensor device, which is not limited by the embodiments of the present disclosure.

In at least one embodiment of the present disclosure, the detector unit A in the first detection region and the sensor unit B in the second detection region for example receive substantially the same power signal. For example, the first detection electrode of the detector unit A and the first sensor electrode of the sensor unit B are connected to the same power source through a power line to receive the same power signal. The fluctuation of the power signal of the detector unit A in the first detection region is the same as the fluctuation of the power signal of the sensor unit B in the second detection region, so that the electrical common mode noise of the first signal detected by the detector unit A in the first detection region is the same as the electrical common mode noise of the second signal detected by the sensor unit B in the second detection region. Therefore, based on the first signal detected by the detector unit A in the first detection region, a noise reduction operation is performed on the second signal detected by the sensor unit B in the second detection region to reduce the noise of the second signal, and improve the signal-to-noise ratio of the second signal. In addition, because the light-shielding metal is not adopted in the embodiments of the disclosure, even in the case where the sensor device according to the embodiments of the present disclosure is disposed in the display region of the display panel, the display effect is not affected.

In at least one embodiment, the noise reduction operation described above for example comprises subtracting the first signal from the second signal; however, it should be understood that the embodiments of the present disclosure are not limited thereto.

As illustrated in FIG. 6-FIG. 8, in at least one embodiment of the present disclosure, the first detection electrode 111 and the first sensor electrode 121 for example are formed in the same layer and have the same shape and size, and the second detection electrode 112 and the second sensor electrode 122 for example are formed in the same layer and have the same shape and size, thereby better performing noise reduction operation, improving the manufacturing process compatibility of the detector unit and the sensor unit, and simplifying the manufacturing process of the sensor device.

In addition, as illustrated in FIG. 6, in at least one embodiment of the present disclosure, in the case where the detector unit A comprises the second photosensitive layer 114, the first photosensitive layer 123 and the second photosensitive layer 114 for example are formed in the same layer and have the same shape and size, thereby better performing noise reduction operation, improving the manufacturing process compatibility of the detector unit and the sensor unit, and simplifying the manufacturing process of the sensor device.

Figure 9:
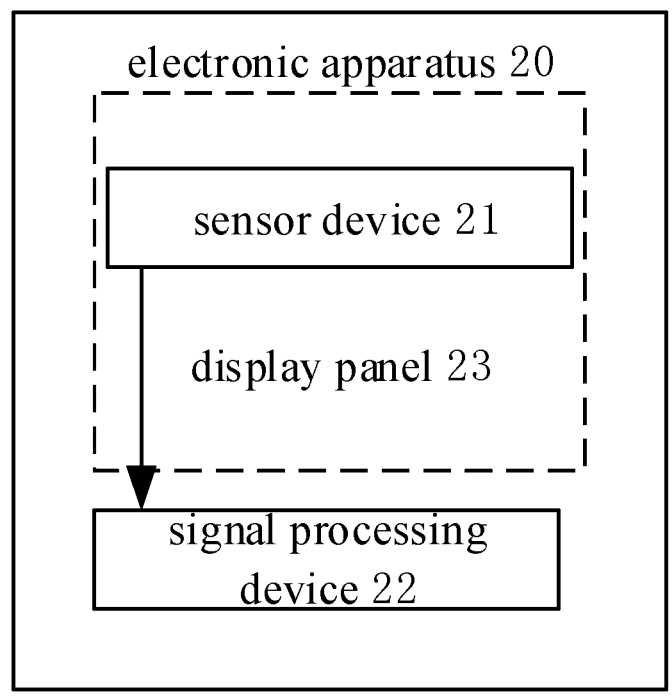
FIG. 9 is a schematic structural diagram of an electronic apparatus according to at least one embodiment of the present disclosure.

FIG. 9 is a schematic structural diagram of an electronic apparatus according to at least one embodiment of the present disclosure. As illustrated in FIG. 9, the electronic apparatus 20 according to at least one embodiment of the present disclosure for example comprises a sensor device 21 and a signal processing device 22. The sensor device 21 for example is the sensor device in any one of the embodiments described above.

The signal processing device 22 is in signal connection with the sensor device 21, the signal processing device 22 is configured to obtain a first signal by at least one detector unit of the first detection region of the sensor device, obtain a second signal by at least one sensor unit of the second detection region of the sensor device, and perform a noise reduction operation on the second signal by using the first signal as a common mode noise signal of the second signal. The noise reduction operation for example is the same as the aforementioned noise reduction operation, which will not be repeated here.

In at least one embodiment, as illustrated in FIG. 9, the electronic apparatus 20 according to at least one embodiment of the present disclosure for example further comprises a display panel 23.

Figure 10A:
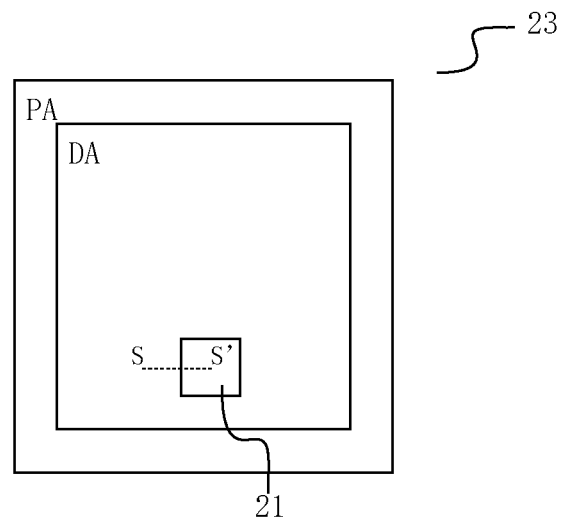
FIG. 10A is a top view of a display panel according to at least one embodiment of the present disclosure.
Figure 10B:
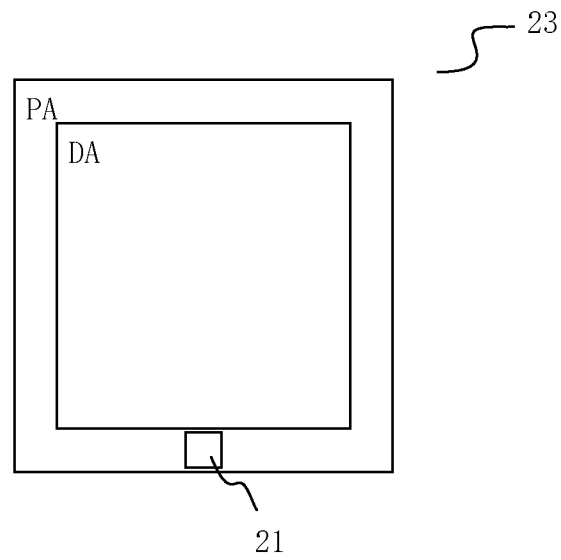
FIG. 10B is another top view of the display panel according to at least one embodiment of the present disclosure.

FIG. 10A is a top view of a display panel according to at least one embodiment of the present disclosure. FIG. 10B is another top view of a display panel according to at least one embodiment of the present disclosure.

As illustrated in FIG. 10A and FIG. 10B, the display panel 23 for example comprises a display region DA and a periphery region PA disposed on a periphery of the display region DA. As illustrated in FIG. 10A, the sensor device 21 for example is provided in the display region DA. As illustrated in FIG. 10B, the sensor device 21 for example is provided in the periphery region PA.

The display panel 23 for example is a liquid crystal display panel, an organic light-emitting diode display panel, a micro-light-emitting-diode display panel, or the like, which is not limited by the embodiments of the present disclosure.

For example, the electronic apparatus 20 for example is: electronic paper, mobile phone, tablet computer, television, monitor, notebook computer, digital photo frame, navigator, watch and other products or components.

Figure 11A:
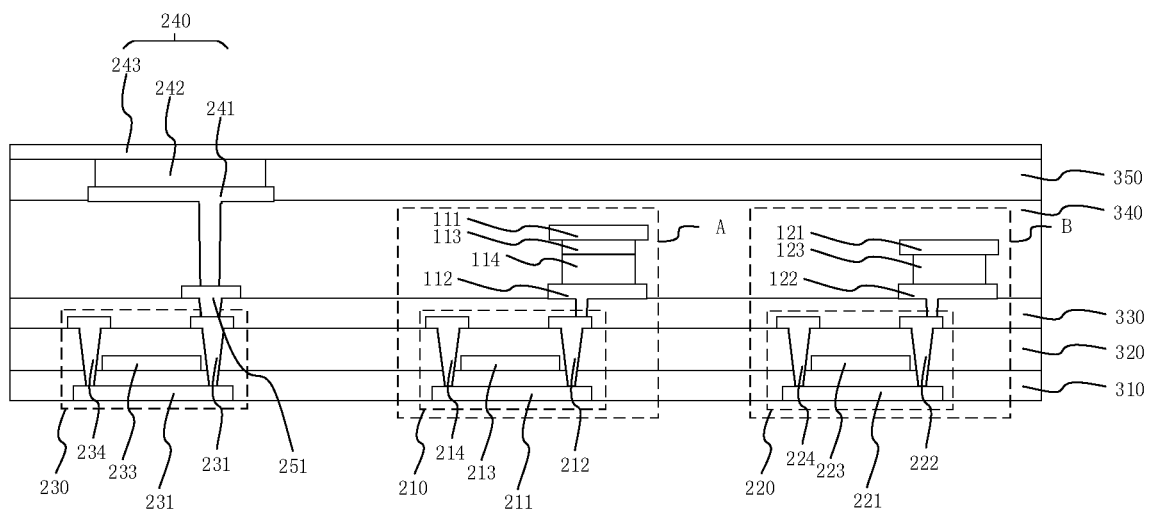
FIG. 11A is a cross-sectional view taken along line S-S' in FIG. 10.

FIG. 11A is a cross-sectional view taken along line S-S' in FIG. 10A. As illustrated in FIG. 11A, the sensor device 21 for example is integrated in the display panel 23. The display panel 23 for example comprises a display driving transistor 230 and a light-emitting unit, and the light-emitting unit for example is an organic light-emitting unit, a quantum dot light-emitting unit, or the like. The following description is made by taking the light-emitting unit being the organic light-emitting unit 240 as an example, but the embodiments of the present disclosure do not limited thereto. The display driving transistor 230 is electrically connected to the organic light-emitting unit 240 to drive the organic light-emitting unit 240 to emit light. In the embodiment illustrated in FIG. 11A, the display panel 23 is illustrated as an organic light-emitting diode display panel; however, it should be understood that embodiments of the present disclosure are not limited thereto.

As illustrated in FIG. 11A, corresponding layers of the display driving transistor 230 and the first switching transistor 210 and the second switching transistor 220 of the sensor device 21 for example are respectively disposed in the same layer. For example, the active layer 231 of the display driving transistor 230 is disposed in the same layer as the first active layer 211 of the first switching transistor 210 and the second active layer 221 of the second switching transistor 220. For example, the gate electrode 233 of the display driving transistor 230 is disposed in the same layer as the first gate electrode 213 of the first switching transistor 210 and the second gate electrode 223 of the second switching transistor 220. For example, the first electrode 231 of the display driving transistor 230 is disposed in the same layer as the first electrode 212 of the first switching transistor 210 and the first electrode 222 of the second switching transistor 220. For example, the second electrode 234 of the display driving transistor 230 is disposed in the same layer as the second electrode 212 of the first switching transistor 210 and the second electrode 222 of the second switching transistor 220. By arranging the display driving transistor 230, the first switching transistor 210 and the second switching transistor 220 in the same layer, it is possible to simplify the formation of the layers of the display panel and reduce the thickness of the sensor device.

However, it should be understood that in other embodiments, some or all of the corresponding layers of the display driving transistor 230, the first switching transistor 210 and the second switching transistor 220 for example are disposed in different layers, which is not limited by the embodiments of the present disclosure.

A planarization layer 340 for example covers the detector unit A and the sensor unit B. A pixel defining layer 350 covers the planarization layer 340. The organic light-emitting unit 240 comprises an anode 241, an organic light-emitting layer 242 and a cathode 243 that are stacked. The organic light-emitting layer 242 is provided between the anode 241 and the cathode 243. The anode 241 for example is electrically connected to the first electrode 231 of the display driving transistor 230 through a relay electrode 251. A part of the relay electrode 251 is on the second interlayer insulating layer 330, and another part of the relay electrode 251 passes through a via hole in the second interlayer insulating layer 330 to be electrically connected to the first electrode 231 of the display driving transistor 230. A part of the anode 241 is on the planarization layer 340 and another part of the anode 241 passes through a via hole in the planarization layer 340 to be electrically connected to the relay electrode. The anode 241 and the organic light-emitting layer 242 for example are located in the opening of the pixel defining layer 350. However, it should be understood that the organic light-emitting unit 240 for example is disposed in the same layer as the detector unit A and the sensor unit B. For example, the anode 241 is disposed in the same layer as the second detection electrode 112 and the second sensor electrode 122, and the pixel defining layer 350 for example directly covers the detector unit A and the sensor unit B without the planarization layer 340, which is not limited by the embodiments of the present disclosure.

The anode 241 for example is formed of the same material as the second detection electrode 112 and the second sensor electrode 122. For example, examples of the material of the anode 241 comprises, but are not limited to, nickel (Ni), silver (Ag), gold (Au), platinum (Pt), palladium (Pd), selenium (Se), rhodium (Rh), ruthenium (Ru), iridium (Ir), rhenium (Re), tungsten (W), molybdenum (Mo), chromium (Cr), tantalum (Ta), niobium (Nb), aluminum (Al), iron (Fe), cobalt (Co), copper (Cu) or their alloys or their oxides, or tin oxide, indium tin oxide (ITO), zinc oxide, titanium oxide, PEDOT:PSS (3,4-ethylenedioxythiophene:poly(4)-styrene sulfonic acid)), PANI (polyaniline), etc.

The cathode 243 for example is formed of the same material as the first detection electrode 111 and the first sensor electrode 121. For example, examples of the material of the cathode 243 comprises, but are not limited to, magnesium (Mg), calcium (Ca), indium (In), lithium (Li), aluminum (Al), silver (Ag), or their alloys or their fluorides, such as Magnesium (Mg)-silver (Ag) alloy, lithium (Li)-fluorine compound, lithium (Li)-oxygen (O) compound, etc.

The organic light-emitting layer 242 for example emits red light, blue light, green light, yellow light, white light, etc., which is not limited by the embodiments of the present disclosure. The material of the organic light-emitting layer 242 in the embodiments of the present disclosure for example is selected according to the color of the light to be emitted.

In addition, as needed, the material of the organic light-emitting layer 242 in the embodiments of the present disclosure comprises a fluorescent light-emitting material or a phosphorescent light-emitting material. Currently, a doping system is usually used, that is, a doping material is mixed into a host light-emitting material to obtain a usable light-emitting material. For example, the host light-emitting material uses metal complexes, derivatives of anthracene, aromatic diamine compounds, triphenylamine compounds, aromatic triamine compounds, biphenyl diamine derivatives, or triarylamine polymers; more specifically, for example, bis(2-methyl-8-hydroxyquinoline-N1,O8)-(1,1'-biphenyl-4-hydroxy)aluminum (Balq), 9,10-bis-(2-naphthalene) base) anthracene (ADN), 4,4'-bis(9-carbazole)biphenyl (CBP), 4,4',4"-tris-9-carbazolyl triphenylamine (TCTA) or N,N-Bis(α-naphthyl-phenyl)-4,4-benzidinediamine (NPB), etc. The fluorescent light-emitting material or the doping material comprises, for example, coumarin dyes (coumarin 6, C-545T), quinacridone (DMQA), or 4-(dicarbonitrile methyleneidene)-2-methyl-6-(4-dimethylamino-styrene)-4H-pyran (DCM) series, etc. The phosphorescent light-emitting material or the doping material comprises, for example, metal complexes based on the metal such as Ir, Pt, Ru, Cu, etc., such as: FIrpic, Fir6, FirN4, FIrtaz, Ir(ppy)3, Ir(ppy)2(acac), PtOEP, (btp)2Iracac, Ir(piq) 2 (acac) or (MDQ) 2 Iracac, etc. In addition, the material of the organic light-emitting layer 242 in the embodiments of the present disclosure for example comprises double host materials doped with the doping material.

In addition, the organic light-emitting unit 240 for example further comprises a hole injection layer, a hole transport layer, an electron injection layer, an electron transport layer, and the like, which will not be repeated in the embodiments of the present disclosure.

For example, the cathode 243, the pixel defining layer 350 and the first sensor electrode 121 are at least partially transparent to allow light reflected by a user's finger to irradiate the first light sensing layer 123 for fingerprint recognition.

Figure 11B:
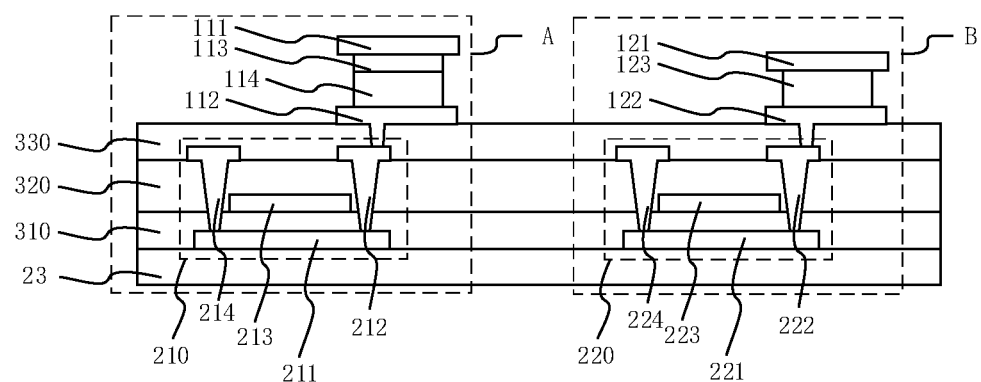
FIG. 11B is another cross-sectional view taken along line S-S' in FIG. 10.

In at least one embodiment of the present disclosure, the sensor device 21 for example is attached to or is fabricated directly on the display panel 23. FIG. 11B is another cross-sectional view taken along line S-S' in FIG. 10. As illustrated in FIG. 11B, the sensor device 21 for example is located above the display panel 23. However, it should be understood that the sensor device 21 for example is located under the display panel 23, as long as the function of the sensor device 21 is not affected, which is not limited in the embodiments of the present disclosure.

It should be noted that, for the sake of clarity, the entire structure of the electronic apparatus is not given. In order to realize the necessary functions of the electronic apparatus, those skilled in the art can set other structures not illustrated according to specific application scenarios, which are not limited in the embodiments of the present disclosure. For the technical effect of the electronic apparatus provided by the embodiments of the present disclosure, reference for example is made to the technical effect of the sensor device described in the above embodiments, and will not be repeated here.

Figure 12:
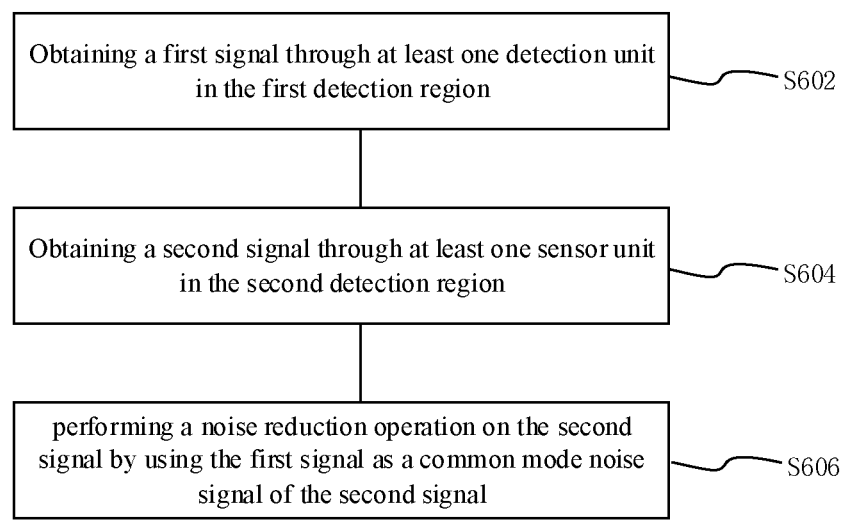
FIG. 12 is a schematic flowchart of a method for reducing signal noise according to at least one embodiment of the present disclosure.

FIG. 12 is a schematic flowchart of a method for reducing signal noise according to at least one embodiment of the present disclosure. The method for reducing signal noise according to at least one embodiment of the present disclosure for example is applied to the sensor device in any one of the above-described embodiments.

As illustrated in FIG. 12, the method for reducing signal noise according to at least one embodiment of the present disclosure for example comprises steps S602 to S606.

Step S602: Obtaining a first signal through at least one detector unit in the first detection region. The detector unit for example comprises a first detection electrode, a second detection electrode and a first insulating layer, and the first detection electrode is electrically insulated from the second detection electrode by the first insulating layer.

Step S604: Obtaining a second signal through at least one sensor unit in the second detection region. The sensor unit for example comprises a first sensor electrode, a second sensor electrode and a first photosensitive layer, and the first photosensitive layer is electrically connected to the first sensor electrode and the second sensor electrode.

Step S606: Performing a noise reduction operation on the second signal by using the first signal as a common mode noise signal of the second signal. The noise reduction operation for example comprises subtracting the first signal from the second signal; however, it should be understood that embodiments of the present disclosure are not limited to this.

The following points need to be noted:

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

The foregoing embodiments merely are exemplary embodiments of the disclosure and not intended to define the scope of the disclosure, and the scope of the disclosure is determined by the appended claims.

What is claimed is:

1. A sensor device, comprising a first detection region and a second detection region, wherein
   the first detection region comprises at least one detector unit,
   the detector unit comprises a first detection electrode and a second detection electrode opposed to each other and a first insulating layer,
   the first detection electrode is electrically insulated from the second detection electrode by the first insulating layer,
   the second detection region comprises at least one sensor unit,
   the sensor unit comprises a first sensor electrode, a second sensor electrode and a first photosensitive layer, and the first photosensitive layer is electrically connected to the first sensor electrode and the second sensor electrode,
   wherein the detector unit further comprises a second photosensitive layer, the second photosensitive layer is interposed between the first detection electrode and the second detection electrode, and the second photosensitive layer is electrically insulated from the first detection electrode through the first insulating layer.

2. The sensor device according to claim 1, wherein the first detection region is on a periphery of the second detection region and does not overlap with the second detection region.

3. The sensor device according to claim 1, wherein the detector unit further comprises a second insulating layer, and the second photosensitive layer is electrically insulated from the second detection electrode through the second insulating layer.

4. The sensor device according to claim 1, wherein the second photosensitive layer includes a first P-type semiconductor sub-layer, a first intrinsic sub-layer and a first N-type semiconductor sub-layer which are sequentially stacked between the first detection electrode and the second detection electrode.

5. The sensor device according to claim 1, wherein
   the first detection electrode is at least partially transparent; or
   the second detection electrode is at least partially transparent; or
   both the first detection electrode and the second detection electrode are at least partially transparent.

6. The sensor device according to claim 1, wherein
   the detector unit further comprises a first switching transistor, and
   a first electrode of the first switching transistor is electrically connected to the first detection electrode or the second detection electrode.

7. The sensor device according to claim 6, further comprising a first gate signal line and a first signal read line, wherein
   the first gate signal line is electrically connected to a gate electrode of the first switching transistor, and
   the first signal read line is electrically connected to a second electrode of the first switching transistor.

8. The sensor device according to claim 1, wherein the at least one detector unit comprises a plurality of detector units, and the plurality of detector units are arranged in an array.

9. The sensor device according to claim 1, wherein the first photosensitive layer is interposed between the first sensor electrode and the second sensor electrode, and comprises a second P-type semiconductor sub-layer, a second intrinsic sub-layer and a second N-type semiconductor sub-layer that are sequentially stacked between the first sensor electrode and the second sensor electrode.

10. The sensor device according to claim 1, wherein
    the first sensor electrode is at least partially transparent; or
    the second sensor electrode is at least partially transparent; or
    both the first sensor electrode and the second sensor electrode are at least partially transparent.

11. The sensor device according to claim 1, wherein
    the sensor unit further comprises a second switching transistor, and a first electrode of the second switching transistor is electrically connected to the first sensor electrode or the second sensor electrode.

12. The sensor device according to claim 11, further comprising a second gate signal line and a second signal read line,
    the second gate signal line is electrically connected to a gate electrode of the second switching transistor, and
    the second signal read line is electrically connected to a second electrode of the second switching transistor.

13. The sensor device according to claim 1, wherein the at least one sensor unit comprises a plurality of sensor units, and the plurality of sensor units are arranged in an array.

14. The sensor device according to claim 1, wherein
    the first detection electrode and the first sensor electrode are provided in a same layer and have a same shape and size,
    the second detection electrode and the second sensor electrode are provided in a same layer and have a same shape and size.

15. The sensor device according to claim 1, wherein
    the first detection electrode and the first sensor electrode are provided in a same layer and have a same shape and size,
    the second detection electrode and the second sensor electrode are provided in a same layer and have a same shape and size,
    the first photosensitive layer and the second first photosensitive layer are provided in a same layer and have a same shape and size.

16. An electronic apparatus, comprising:
    the sensor device according to claim 1; and
    a signal processing device, in signal connection with the sensor device, wherein the signal processing device is configured to obtain a first signal by the at least one detector unit of the first detection region and obtain a second signal by the at least one sensor unit of the second detection region of the sensor device, and perform a noise reduction operation on the second signal by using the first signal as a common mode noise signal of the second signal.

17. The electronic apparatus according to claim 16, further comprising a display panel, wherein
the display panel comprises a display region and a periphery region disposed on a periphery of the display region,
the sensor device is disposed in the display region or in the periphery region.

18. A method for reducing signal noise, comprising:
obtaining a first signal through at least one detector unit in a first detection region, wherein the detector unit comprises a first detection electrode, a second detection electrode and a first insulating layer, and the first detection electrode is electrically insulated from the second detection electrode by the first insulating layer, and the detector unit further comprises a second photosensitive layer, the second photosensitive layer is interposed between the first detection electrode and the second detection electrode, and the second photosensitive layer is electrically insulated from the first detection electrode through the first insulating layer;
obtaining a second signal through at least one sensor unit in a second detection region, wherein the sensor unit comprises a first sensor electrode, a second sensor electrode and a first photosensitive layer, and the first photosensitive layer is electrically connected to the first sensor electrode and the second sensor electrode; and
performing a noise reduction operation on the second signal by using the first signal as a common mode noise signal of the second signal.

19. The electronic apparatus according to claim 17, wherein the display panel comprises a light-emitting unit, and every two of the detection unit, the sensor unit and the light-emitting unit are arranged apart from each other.

20. The electronic apparatus according to claim 16, further comprising a display panel, wherein the detector unit and the sensor unit are arranged on a surface of the display panel, and a maximum size of the detector unit in a direction perpendicular to the surface of the display panel is greater than a maximum size of the sensor unit in the direction perpendicular to the surface of the display panel.

* * * * *